US012633935B2

(12) United States Patent
Aboushady et al.

(10) Patent No.: US 12,633,935 B2
(45) Date of Patent: May 19, 2026

(54) ELECTRONIC DEVICE FOR DIGITAL TO ANALOG CONVERSION OF A DIGITAL INPUT STREAM INTO A DIFFERENTIAL ANALOG OUTPUT

(71) Applicants: SORBONNE UNIVERSITE, Paris (FR); CENTRE NATIONAL DE LA RECHERCHE SCIENTIFIQUE, Paris (FR)

(72) Inventors: Hassan Aboushady, Paris (FR); Islam Eshra, Montazah (EG)

(73) Assignees: SORBONNE UNIVERSITÉ, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 74 days.

(21) Appl. No.: 18/695,683

(22) PCT Filed: Sep. 29, 2021

(86) PCT No.: PCT/IB2021/000677

§ 371 (c)(1),
(2) Date: Mar. 26, 2024

(87) PCT Pub. No.: WO2023/052803

PCT Pub. Date: Apr. 6, 2023

(65) Prior Publication Data

US 2024/0396566 A1 Nov. 28, 2024

(51) Int. Cl.
$H03M\ 1/06$ (2006.01)
$H03K\ 5/14$ (2014.01)
(Continued)

(52) U.S. Cl.
CPC ............ *H03M 1/0626* (2013.01); *H03K 5/14* (2013.01); *H03K 2005/00019* (2013.01); *H03K 19/20* (2013.01)

(58) Field of Classification Search
CPC ....... H03M 1/0626; H03K 5/14; H03K 19/20; H03K 2005/00019
(Continued)

(56) References Cited

U.S. PATENT DOCUMENTS 4,598,269 A * 7/1986 Penney .................. H03M 1/02
                                                341/122
5,323,157 A * 6/1994 Ledzius ................ H03M 3/504
                                                708/319
(Continued)

FOREIGN PATENT DOCUMENTS

WO        2009034494        3/2009

OTHER PUBLICATIONS

Lin Andrew C Y et al: "A CMOS Oversampled DAC with Multi-Bit Semi-Digital Filtering and Boosted Subcarrier SNR for ADSL Central Office Modems", IEEE Journal of Solid-State Circuits, vol. 41, No. 4, Apr. 1, 2006, pp. 868-875.
(Continued)

*Primary Examiner* — Zhen Y Wu
(74) *Attorney, Agent, or Firm* — Perman & Green, LLP

(57) ABSTRACT

An electronic device for digital to analog conversion is proposed. Such device implements a finite impulse response filter and includes: a delay line taking as an input a digital input stream and implementing a number of successive delay cells, each delay cell outputting a corresponding delayed version of the digital input stream to be processed by a corresponding coefficient of the filter; for at least one coefficient of the finite impulse response filter, a number of positive current sources, contributing to a positive current component of a differential analog output of the device and negative current sources, contributing to a negative current component of the differential analog output. The current component contribution of the positive and negative current (Continued)

sources are reconfigurable between predetermined values for allowing the value of the coefficient to be reconfigurable.

15 Claims, 8 Drawing Sheets

(51) Int. Cl.
  *H03K 5/00*     (2006.01)
  *H03K 19/20*    (2006.01)
(58) Field of Classification Search
  USPC .......................................................... 341/118
  See application file for complete search history.

(56)                References Cited

U.S. PATENT DOCUMENTS

| | | | | |
|---|---|---|---|---|
| 5,574,452 | A * | 11/1996 | Longo | H03M 3/324 |
| | | | | 341/172 |
| 6,308,190 | B1 * | 10/2001 | Willson, Jr. | H03H 17/0275 |
| | | | | 708/319 |
| 6,489,908 | B2 * | 12/2002 | Panasik | H03M 3/50 |
| | | | | 341/120 |
| 7,026,970 | B2 * | 4/2006 | Wang | H03M 7/3042 |
| | | | | 341/143 |
| 7,414,558 | B2 * | 8/2008 | Rivoir | H03M 1/74 |
| | | | | 341/118 |
| 7,528,754 | B1 * | 5/2009 | Bakkaloglu | H03M 3/504 |
| | | | | 375/295 |
| 7,535,396 | B1 * | 5/2009 | Melanson | H03M 3/504 |
| | | | | 341/145 |
| 8,519,877 | B1 * | 8/2013 | Baranwal | H03M 1/0604 |
| | | | | 330/284 |
| 2002/0080053 | A1 * | 6/2002 | Brooks | H03M 3/502 |
| | | | | 341/143 |
| 2002/0129070 | A1 * | 9/2002 | Mallinson | H03H 15/00 |
| | | | | 708/5 |
| 2003/0035474 | A1 * | 2/2003 | Gorecki | H04L 25/03038 |
| | | | | 375/229 |
| 2005/0179574 | A1 * | 8/2005 | Wang | H03M 7/3042 |
| | | | | 341/143 |
| 2007/0024481 | A1 * | 2/2007 | Rivoir | H03M 1/007 |
| | | | | 341/144 |
| 2009/0243682 | A1 * | 10/2009 | Huang | H04L 25/0292 |
| | | | | 327/170 |
| 2011/0282924 | A1 * | 11/2011 | Mallinson | H03H 15/00 |
| | | | | 327/356 |
| 2012/0056676 | A1 * | 3/2012 | Frambach | H03F 3/193 |
| | | | | 330/295 |
| 2013/0027233 | A1 * | 1/2013 | Nozaki | H03M 1/12 |
| | | | | 341/118 |
| 2013/0207827 | A1 * | 8/2013 | Nestler | H03H 7/0138 |
| | | | | 341/172 |
| 2015/0061911 | A1 * | 3/2015 | Pagnanelli | H03M 3/30 |
| | | | | 341/144 |
| 2017/0214397 | A1 * | 7/2017 | Hu | H03K 5/135 |
| 2017/0288693 | A1 * | 10/2017 | Kumar | H03M 3/468 |
| 2019/0341923 | A1 * | 11/2019 | Conzatti | H03M 3/464 |

OTHER PUBLICATIONS

Gebreyohannes Fikre Tsigabu et al: "All-Digital Transmitter Architecture Based on Two-Path Parallel 1-bit High Pass Filtering DACs", IEEE Transactions on Circuits and Systems I: Regular Papers, 2018, pp. 1-14.

International Search Report for application No. PCT/IB2021/000677 dated May 24, 2022.

Henriques B G et al., "A High-Speed Programmable CMOS Interface System Combining D/A Conversion and FIR Filtering", IEEE Journal of Solid-State Circuits, IEEE, USA, vol. 29, No. 8, Aug. 1, 1994, pp. 972-977, XP000460924, ISSN: 0018-9200, DOI: 10.1109/4.297706, Abstract; Section II; figures 1-4, table I.

Kimmo Koli et al., "A 900-MHz Direct Delta-Sigma Receiver in 65-nm CMOS", IEEE Journal of Solid-State Circuits, vol. 45, No. 12, Dec. 1, 2010, pp. 2807-2818, XP055262943, USA ISSN: 0018-9200, DOI: 10.1109/JSSC.2010.2075270 Section VI; figure 7.

Ferrat P et al., "A 13-b 1.1-MHz Oversampled DAC With Semidigital Reconstruction Filtering", IEEE Journal of Solid-State Circuits, IEEE, USA, vol. 39, No. 12, Dec. 1, 2004, pp. 2098-2106, XP011122645, ISSN: 0018-9200, DOI: 10.1109/JSSC.2004.836238 Section IV; figure 8.

Huang Qiuting et al., "Analog FIR Filters With an Oversampled Sigma Delta Modulators", IEEE Transactions on Circutis and Systems II: Analog and Digital Signal Processing, Institute of Electrical and Electronics Engineers Inc, 345 EAST 47 Street, New York NY 10017, USA, vol. 39, No. 9, Sep. 1, 1992, pp. 658-663, XP000360387, ISSN: 1057-7130, DOI: 10. 1109/82.193321 Section V; Section VII; figure 8.

* cited by examiner

ELECTRONIC DEVICE FOR DIGITAL TO ANALOG CONVERSION OF A DIGITAL INPUT STREAM INTO A DIFFERENTIAL ANALOG OUTPUT

CROSS REFERENCE TO RELATED APPLICATIONS

This application is a National Stage of International Application No. PCT/IB2021/000677, having an International Filing Date of 29 Sep. 2021, which designated the United States of America, and which International Application was published under PCT Article 21(2) as WO Publication No. 2023/052803 A1, the disclosure of which is incorporated herein by reference in its entirety.

BACKGROUND

Field

The field of the disclosure is that of the digital to analog data conversion.

More specifically, the disclosure relates to a digital to analog converter (DAC) that implements at the same time a finite impulse response (FIR) filter. Such electronic device is classically referred to as a FIRDAC.

The disclosure can be of interest in any field where a FIRDAC can be used for digital to analog data conversion. This is the case for instance for the generation of audio or video signals, in the field of sensors or actuators, or in the field of communications (wireless or wired), e.g. for the generation of modulating signals or for the direct generation of bandpass modulated signals.

Brief Description of Related Developments

In the context of data conversion, a DAC is responsible for the conversion of data from discrete digital signal into continuous analog signal. However, in practical electronic implementations, the device implementing the DAC functionality behaves as a sample and hold that delivers a staircase analog signal function of the digital data to be converted. Such staircase analog signal thus requires the implementation of a reconstruction analog filtering, e.g. low pass filtering, for smoothing the analog signal (current or voltage) by canceling the spectral replica.

A FIRDAC is a semi-digital circuit that merges the functionalities of DAC and FIR reconstruction filtering. Hence the conversion from digital to analog is done by one block rather than two separate blocks. FIG. 1 shows the conceptual diagram for a conventional FIRDAC 100, e.g. as disclosed in the article by Lin, Andrew C Y, et al. "*A CMOS oversampled DAC with multi-bit semi-digital filtering and boosted subcarrier SNR for ADSL central office modems.*" in IEEE journal of solid-state circuits 41.4 (2006): 868-875, or in the article by Gebreyohannes, Fikre Tsigabu, et al. "*All-digital transmitter architecture based on two-path parallel 1-bit high pass filtering DACs.*" in IEEE Transactions on Circuits and Systems I: Regular Papers 65.11 (2018): 3956-3969.

More particularly, the FIRDAC 100 is composed of a delay line 110 which is in turn composed of a predetermined number N−1 of unit delay cells 110*dc*. The delay cells 110*dc* implement a same predetermined elementary delay. The number N−1 of delay cells indicates the order N−1 of the FIR filter. The coefficients of the FIRDAC 100 $a_0$, $a_1$, $a_2$, . . . $a_{N-1}$ (i.e. the coefficients of the impulse response of the FIR) are implemented using k-bits DACs 120. The Least Significant Bit (LSB) of a k-bits DAC 120 is weighted by the corresponding coefficient. In the implementation of FIG. 1, a current steering DAC implementation is shown, where the least significant current is multiplied by the coefficient. Those coefficients' weights represent the FIRDAC impulse response. The total output analog current $I_{out_q}$, is the summation of each coefficient output quantized current $Iq_n$, and given by:

$$I_{out_q} = \sum_{n=0}^{N-1} Iq_n Z^{-n}$$

The implementation of such k-bits DACs for the coefficients of the FIRDAC requires a high number of electronic circuits to be physically implemented in the silicon die at the end.

Furthermore, such FIRDACs are considered in various technological fields, among which the wireless communications. More particularly, FIRDACs are considered for the generation of RF modulated bandpass signals in integrated transmitters. However, electronic devices dedicated to mobile telephony target the support for different wireless standards that each have their requirements in term of modulation, spectral shape, bandwidth, etc. For an efficient implementation, a same transmitter should thus be able to implement different wireless standards.

There is thus a need for an FIRDAC that allows addressing different system requirements. However, as discussed above, the implementation of an FIRDAC requires a high number of electronic circuits to be physically implemented in the silicon at the end. There is thus a need that the possibility to address different system requirements does not lead to a significant increase in the electronic circuits to be physically implemented.

SUMMARY

A particular aspect of the present disclosure relates to an electronic device for digital to analog conversion of a digital input stream into a differential analog output, such device implements a filtering of the digital input stream based on a finite impulse response filter comprising:

a delay line taking as an input the digital input stream. The delay line implements a number of successive delay cells, each delay cell outputting a corresponding delayed version of the digital input stream to be processed by a corresponding coefficient of the filter;

for at least one coefficient of the finite impulse response filter, a number of current sources comprising current sources, named positive current sources, contributing to a positive component of the differential analog output and current sources, named negative current sources, contributing to a negative component of the differential analog output. The positive component contribution of the positive current sources and the negative component contribution of the negative current sources are each proportional to the coefficient according to a same proportionality factor for implementing the coefficient. The positive component contribution of the positive current sources and the negative component contribution of the negative current sources are reconfigurable between predetermined values for allowing the value of the coefficient to be reconfigurable.

Thus, the present disclosure proposes a new and inventive solution for the flexible generation of an analog signal from a digital input stream using a finite impulse response filter digital to analog converter (FIRDAC).

More particularly, reconfigurability of the amount of current output by positive and negative current sources (e.g. through the reconfigurability of the number of positive and negative current sources, or through the reconfigurability of the amount of current that can be output by a given positive or negative current source) allows having the coefficients of the filter to be reconfigurable (or programmable). Changing the filter's coefficients allows to modify the specifications of the FIRDAC: the passband frequency, Fp, the stopband frequency, Fs, as well as the passband ripples, Rp, and the stopband attenuation, As.

In some aspects, the delay line implements a programmable number of the delay cells.

Thus, the length of the impulse response of the filter is programmable. This allows to increase or decrease the order of the filter which affects the FIRDAC's specifications: passband ripples, Rp, stopband attenuation, As, and the transition frequency, $\Delta F=Fs-Fp$.

In some aspects, at least one of the delay cells implements a programmable delay comprising an elementary delay or twice the elementary delay.

For instance, the at least one delay cell implements the elementary delays as flip-flop that can be by-passed for allowing the delay line to have either a delay of one clock period or a delay of two clock periods.

In some aspects, the at least one of the delay cells implements in inversion of the logical value of the delayed bits.

Thus, the type of filter (e.g. lowpass, highpass or bandpass) is programmable.

In some aspects, the finite impulse response is symmetrical and for at least one couple of symmetric coefficients of same value of said symmetric finite impulse response filter:
the positive current sources implementing the coefficients of the couple are configured based on an output of at least one logical function, named positive function, involving the two bits simultaneously processed by the coefficients of same value,
the negative current sources implementing the coefficients of the couple are configured based on an output of at least one logical function, named negative function, involving the two bits.
The at least one positive and negative functions are configured such that:
when the two bits have different logical values: the positive current sources and the negative current sources implementing the coefficients of the couple output a same amount of current, the differential analog output being null; and
when the two bits have a same logical value: the positive current sources or the negative current sources implementing the coefficients of the couple are turned OFF so that the differential analog output has a magnitude proportional to the same value of the coefficients and a sign given by the same logical value.
Thus, for a given couple of symmetric coefficients of same value, the comparison and recombination of the bits intended to be processed by coefficients of same value allows deriving the configuration of the current sources implementing the corresponding couple of symmetric coefficients of the filter in an inventive way. Compared to known implementation wherein each of those bits is processed independently for controlling corresponding current sources, the proposed solution allows reducing the number of current sources required for achieving a given impulse response.

In some aspects, the positive current sources implementing the coefficients of the couple are configured based on an output of one positive function and the negative current sources implementing the coefficients of the couple are configured based on an output of one negative function. The positive function and the negative function are such that when the two bits have different logical values, the positive current sources implementing the coefficients of the couple are turned OFF and the negative current sources implementing the coefficients of the couple are turned OFF, the differential analog output being null.

Thus, the implementation of the device is simple.

In some aspects, the positive function implements a logical AND function of the two bits. The negative function implements a logical NOR function of the two bits.

In some aspects, the positive current sources implementing the coefficients of the couple comprise first positive current sources configured based on an output of a first positive function and second positive current sources configured based on an output of a second positive function. The negative current sources implementing the coefficients of the couple comprise first negative current sources configured based on an output of a first negative function and second negative current sources configured based on an output of a second negative function. The first and second positive and negative functions are configured such that, when the two bits have different logical values:
one of the first and second positive current sources is turned ON, the other one of the first and second positive current sources being turned OFF; and
one of the first and second negative current sources is turned ON, the other one of the first and second negative current sources being turned OFF.
The positive current sources turned ON and the negative current sources turned ON output a same amount of current, the differential analog output being null.

Thus, all the current sources are always active regardless the value of the output differential current. This allows improving the performances that can be experienced on the differential output signal (e.g. reducing glitches).

In some aspects, the first positive function implements a logical AND function of the two bits. The first negative function implements a logical NAND function of the two bits.

In some aspects, the second positive function implements a logical OR function of the two bits. The second negative function implements a logical NOR function of the two bits.

In some aspects, at least one of the positive current sources comprise a transistor, named positive switch transistor, controlled as a switch for allowing or preventing current to flow from the corresponding positive current source. At least one of the negative current sources comprise a transistor, named negative switch transistor, controlled as a switch for allowing or preventing current to flow from the corresponding negative current source. A first capacitor is connected between, on one hand, a control pin of the positive switch transistor and, on the other hand, an output pin of the negative switch transistor from which the current to be controlled is allowed or prevented to flow as a function of a voltage state on said control pin. A second capacitor is connected between, on one hand, a control pin of the negative switch transistor and, on the other hand, an output pin of the positive switch transistor from which the current to be controlled is allowed or prevented to flow as a function of a voltage state on the control pin.

Thus, the high frequency behavior of the current sources for their turning ON and OFF is improved. The control pin of the positive and negative switch transistors corresponds to the pin allowing to turn the transistors ON or OFF. For instance, this may be the gate pin of MOS transistors that are in turn put in series along the path of the current to be controlled. The output pin of the positive and negative switch transistors corresponds in that case to the pin from which the current to be controlled flows, e.g. the source or drain pin of MOS transistors.

In some aspects, the electronic device comprises at least one cell comprising:

a positive current source comprising a positive switch transistor controlled as a switch for allowing or preventing current to flow from the corresponding positive current source; and
    a negative current source comprising a negative switch transistor controlled as a switch for allowing or preventing current to flow from the corresponding negative current source.

A control pin of the positive switch transistor is controlled by a signal resulting of a logical function of, on one hand, a control signal and, on the other hand, an enable signal common to all positive current sources and generated based on the first positive function or on the second positive function. A control pin of the negative switch transistor is controlled by a signal resulting of a logical function of, on one hand, the control signal and, on the other hand, an enable signal common to all positive current sources and generated based on the first negative function or on the second negative function.

The logical function is e.g. a NAND function or a AND function.

Another aspect of the present disclosure relates to a radiofrequency transmitter system comprising an electronic device as disclosed above (in any of the aspects discussed above).

In some aspects, the radiofrequency transmitter system comprises a sigma-delta modulator for generating the digital input stream.

Another aspect of the present disclosure relates to the use of an electronic device as disclosed above (in any of the aspects discussed above) for generating a radiofrequency signal from a digital input stream.

BRIEF DESCRIPTION OF THE FIGURES

Other features and advantages of aspects shall appear from the following description, given by way of indicative and non-exhaustive examples and from the appended drawings, of which.

DETAILED DESCRIPTION

In all of the figures of the present document, the same numerical reference signs designate similar elements and steps.

Figure 1:
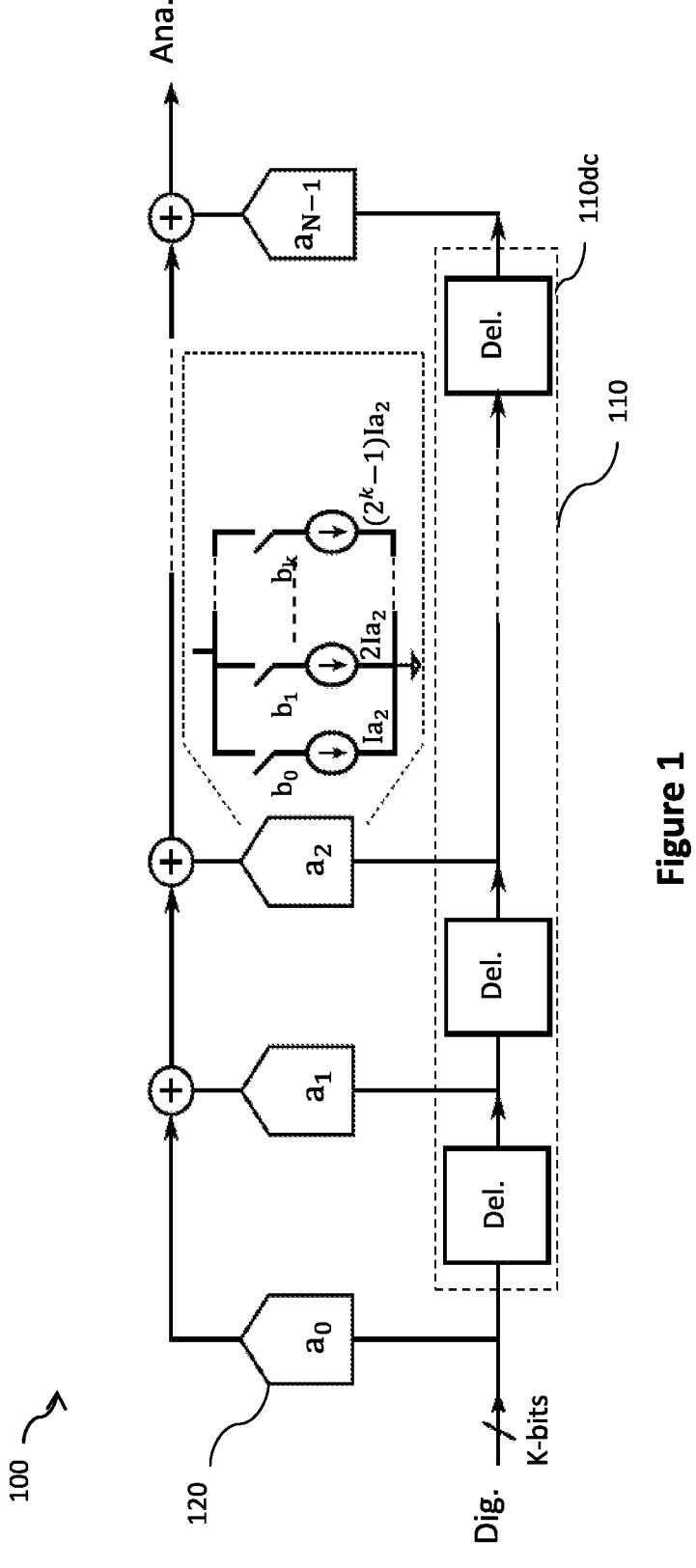
FIG. 1, already discussed above in relation with the technological background, illustrates the functions implemented in a FIRDAC using current steering DACs.
Figure 2:
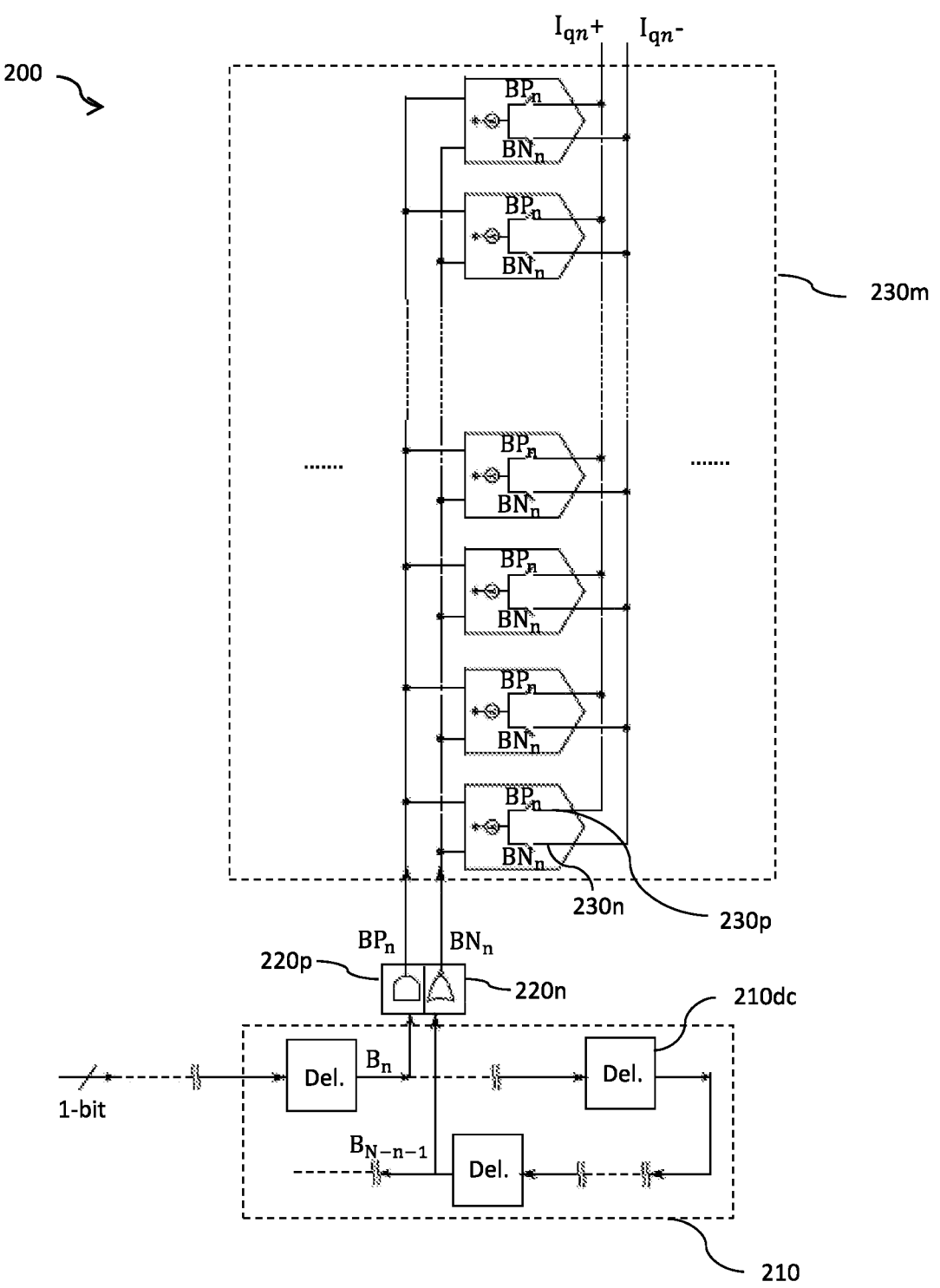
FIG. 2 illustrates some functions implemented in a FIRDAC according to one embodiment of the present disclosure.

Referring now to FIG. 2, we describe some functions implemented in an FIRDAC 200 according to one embodiment of the present disclosure.

More particularly, the FIRDAC 200 implements the digital to analog conversion of a digital input stream into a differential analog output, i.e. an output differential analog current in the present case. However, in other aspects the differential analog output is a voltage, e.g. implementing a conversion stage from current to voltage.

Back to FIG. 2, the digital input stream is a 1-bit width input bits stream. In other words, the input bit stream is a single digital signal (e.g. a two states signal for representing the two logical values of the bits) representing a stream of bits processed in series. However, in other aspects the digital input stream corresponds to input bit streams of width higher than 1.

Back to FIG. 2, the FIRDAC 200 implements a filtering of the digital input stream based on a symmetric FIR filter. In that respect, the FIRDAC 200 comprises a delay line 210. The delay line 210 comprises a number $N-1$ of successive unit delay cells 210dc. Each unit delay cell 210dc outputs a corresponding delayed version, $B_0$, $B_1$, . . . , of the digital input stream to be processed by a corresponding coefficient (or tap) of the FIR filter part of the FIRDAC 200. In the present aspect, the delay line 210 implements a programmable number of delay cells 210dc. Thus, the length of the impulse response of the filter is programmable as discussed below in relation with FIG. 6. The delay cells 210dc are in turn programmable. Thus, the frequency response of the filter is programmable with flexibility as discussed below in relation with FIG. 7. However, in other aspects the delay line and/or the delay cells are non-programmable and the length of the impulse response of the FIR filter is predetermined.

Back to FIG. 2, the FIRDAC 200 implements a matrix 230m of programmable coefficients implementing the coefficients of the FIR filter part of the FIRDAC 200. However, in the present aspect the FIRDAC 200 takes advantage of the symmetry in the impulse response of the filter. More particularly, for at least one couple of symmetric coefficients of same value of the symmetric impulse response, e.g. the coefficients that simultaneously process the two bits $B_n$ and $B_{N-n-1}$ in FIG. 2, the matrix 230m comprises a number of current sources comprising:

current sources, named positive current sources 230p, contributing to a positive current component $I_{qn}+$ of the output differential analog current; and
    current sources, named negative current sources 230n, contributing to a negative current component $I_{qn}-$ of the output differential analog current.

The positive current component contribution $I_{qn}+$ and the negative current component contribution $I_{qn}-$ are proportional to the same value of the considered coefficients, and according to a same proportionality factor. However, the positive current component contribution of the positive current sources 230$p$ and the negative current component contribution of the negative current sources 230$n$ are reconfigurable between predetermined values for allowing the same value of said couple of symmetric coefficients to be reconfigurable. This can be achieved through the reconfigurability of the number of positive 230$p$ and negative 230$n$ current sources, or through the reconfigurability of the amount of current that can be output by a given positive 230$p$ or negative 230$n$ current source. This allows having the coefficients of the filter to be reconfigurable (or programmable).

More particularly, the positive current sources 230$p$ are configured based on an output of a logical function, named positive function 220$p$, involving the two bits $B_n$ and $B_{N-n-1}$ simultaneously processed by the considered coefficients of same value. Correspondingly, the negative current sources 230$n$ are configured based on an output of a logical function, named negative function 220$n$, involving said two bits. The positive function 220$p$ and the and negative function 220$n$ are such that:

when the two bits $B_n$ and $B_{N-n-1}$ have different logical values: the positive current sources 230$p$ and the negative current sources 230$n$ output a same amount of current, which is null in the present case (e.g. the sources are turned OFF, for instance by setting the corresponding transistors as open circuits), so that the output differential analog current is null; and when the two bits $B_n$ and $B_{N-n-1}$ have a same logical value: the positive current sources 230$p$ or the negative current sources 230$n$ are turned OFF so that the output differential analog current has a magnitude proportional to the same value of the coefficients and a sign given by the same logical value.

Compared to known implementation wherein each of the two bits $B_n$ and $B_{N-n-1}$ is processed independently for controlling corresponding current sources, the present aspect allows reducing the number of current sources required for achieving a given impulse response. However, in some aspects, such positive function 220$p$ and negative function 220$n$ are not implemented and the bits $B_n$ and $B_{N-n-1}$ are processed independently for controlling corresponding current sources implementing each a coefficient of the impulse response of the FIR. In such aspects, the positive current sources implementing a given coefficient are controlled independently of the current sources implementing the other coefficients of the FIR. The same holds for the negative current sources. In such aspects, the optimization of the number of current sources discussed above does not occur and the impulse response of the FIR is not necessarily symmetric. However, even in such aspects, the current contribution of the positive and negative sources may be reconfigurable between predetermined values for allowing the value of the coefficients to be reconfigurable. Such reconfigurability may be implemented for all or for only part of the coefficients.

Back to FIG. 2, the positive function 220$p$ implements a logical AND function of the two bits $B_n$ and $B_{N-n-1}$. The positive function 220$p$ outputs a signal $BP_n$ that controls the positive current sources 230$p$. Correspondingly, the negative function 220$n$ implements a logical NOR function of the two bits $B_n$ and $B_{N-n-1}$. The negative function 220$n$ outputs a signal $BN_n$ that controls the negative current sources 230$n$.

Table 1 below shows the truth table of the positive function 220$p$ and of the negative function 220$n$ as well as:

the resulting positive current component contribution $I_{qn}+$ and the negative current component contribution $I_{qn}-$, a magnitude of which is the analog representation of the considered same value of coefficients; and the corresponding output differential current $I_{diffn}=I_{qn+}-I_{qn}-$.

TABLE 1

| | Truth table of the positive function 220p and of the negative function 220n | | | | | |
|---|---|---|---|---|---|---|
| $B_n$ | $B_{N-n-1}$ | $BP_n$ | $BN_n$ | $I_{qn}+$ | $I_{qn}-$ | $I_{diffn}$ |
| 0 | 0 | 0 | 1 | 0 | I | −I |
| 0 | 1 | 0 | 0 | 0 | 0 | 0 |
| 1 | 0 | 0 | 0 | 0 | 0 | 0 |
| 1 | 1 | 1 | 0 | I | 0 | I |

However, in some aspects, the positive function and the negative function implement other logical functions allowing to achieve the above truth table and thus the corresponding control of the current sources.

In some aspects, only part of the couples of symmetric coefficients of same values are implemented according to the optimized technic discussed above. In other aspects, all the couples of symmetric coefficients of same values are implemented according to such optimized technic. However, in any case, for an impulse response corresponding to an odd number of coefficients, at least one coefficient (i.e. the middle coefficient that has no symmetric counterpart of same value) needs to be implemented separately with current sources dedicated to that particular coefficient.

In some aspects, the unit delay cells are not programmable and only the value of the coefficients are reconfigurable through the reconfigurability of the current sources (e.g. through the reconfigurability of the number of positive and negative current sources, or through the reconfigurability of the amount of current that can be output by a given positive or negative current source). This simpler implementation still allows achieving different filtering performances (e.g. in term of out-band attenuation and of in-band ripple) for impulses responses of same length.

Figure 3:
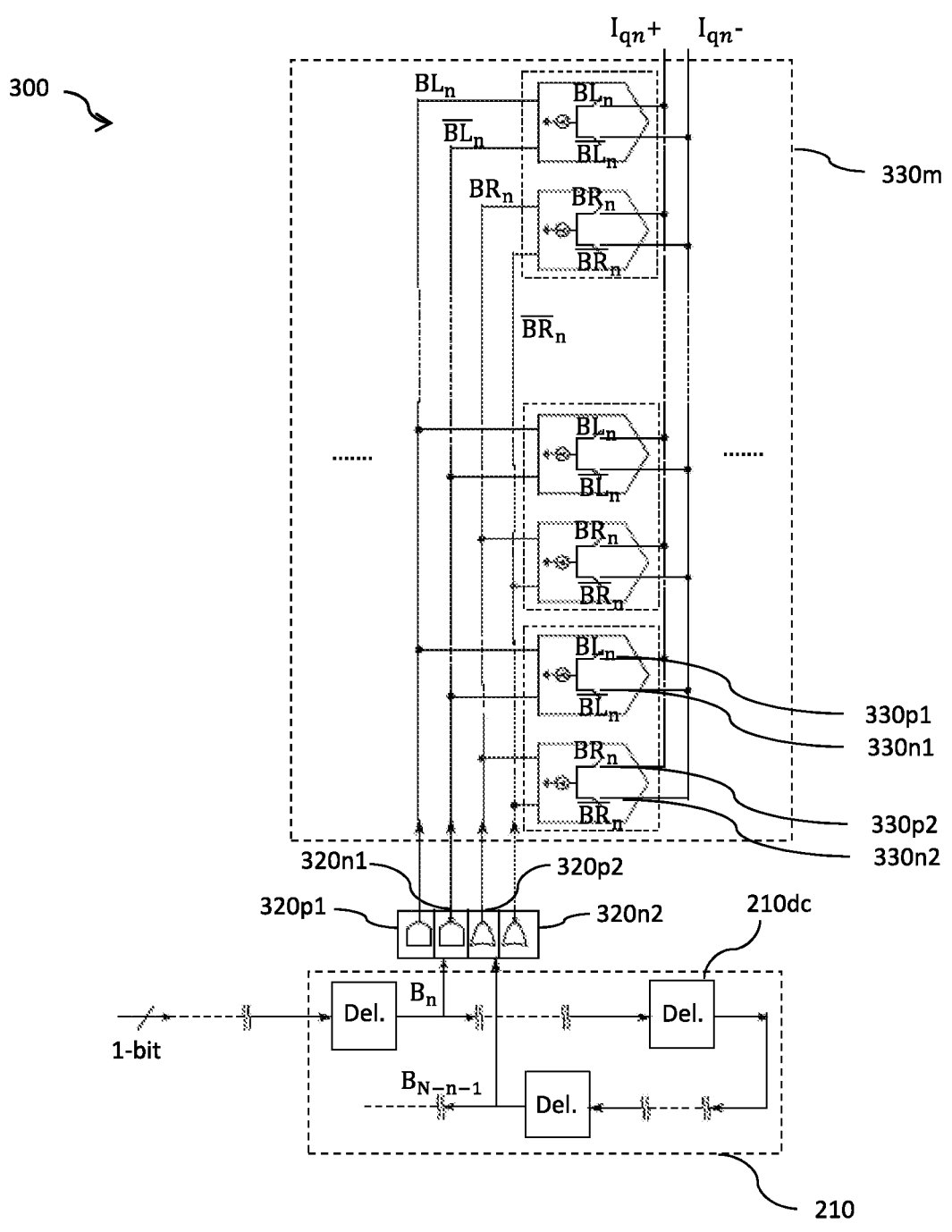
FIG. 3 illustrates some functions implemented in a FIRDAC according to another embodiment of the present disclosure.

Referring now to FIG. 3, we describe some functions implemented in a FIRDAC 300 according to another aspect of the present disclosure.

More particularly, the FIRDAC 300 according to the present aspect also implements a filtering of the digital input stream based on a symmetric FIR filter. However, the matrix 330$m$ of programmable coefficients of the FIRDAC 300 and its associated control differs from the matrix 230$m$ of programmable coefficients of the FIRDAC 200 of FIG. 2 in that the positive current sources now comprise:

first positive current sources 330$p$1 configured based on an output $BL_n$ of a first positive function 320$p$1; and second positive current sources 330$p$2 configured based on an output $BR_n$ of a second positive function 320$p$2.

Correspondingly, the negative current sources now comprise:

first negative current sources 330$n$1 configured based on an output $\overline{BL_n}$ of a first negative function 320$n$1; and second negative current sources 330$n$2 configured based on an output $\overline{BR_n}$ of a second negative function 320$n$2.

The first positive function 320$p$1, the second positive function 320$p$2, the first negative function 320$n$1 and the second negative function 320$n$2 are such that, when the two bits $B_n$ and $B_{N-n-1}$ simultaneously processed by the coefficients of same value have different logical values:

one of the first positive current sources 330p1 and the second positive current sources 330p2 is turned ON, the other one of the first positive current sources 330p1 and the second positive current sources 330p2 being turned OFF; and one of the first negative current sources 330n1 and the second negative current sources 330n2 is turned ON, the other one of the first negative current sources 330n1 and the second negative current sources 330n2 being turned OFF, the positive current sources turned ON and the negative current sources turned ON outputting a same amount of current so that the output differential analog current is null.

Thus, as for the FIRDAC 200 of FIG. 2, the FIRDAC 300 is also configured so that when the two bits $B_n$ and $B_{N-n-1}$ have different logical values: the positive current sources and the negative current sources are configured to output a same amount of current so that the output differential analog current is null. However, in the FIRDAC 300, some positive or negative current sources are always outputting a non-zero current regardless the value of the output differential current. This allows improving the performances that can be experienced on the differential output signal (e.g. in term of linearity performances by reducing the glitches during the switching ON and OFF of the current sources).

Conversely, the first positive function 320p1, the second positive function 320p2, the first negative function 320n1 and the second negative function 320n2 are such that when the two bits $B_n$ and $B_{N-n-1}$ have a same logical value:

the first positive current sources 330p1 and the second positive current sources 330p2; or the first negative current sources 330n1 and the second negative current sources 330n2, are turned OFF so that the output differential analog current has a magnitude proportional to the same value of the coefficients processing the two bits $B_n$ and $B_{N-n-1}$, and a sign given by the same logical value.

For instance, the first positive function 320p1 implements a logical AND function of the two bits $B_n$ and $B_{N-n-1}$ and the first negative function 320n1 implements a logical NAND function of the two bits $B_n$ and $B_{N-n-1}$. Correspondingly, the second positive function 320p2 implements a logical OR function of the two bits $B_n$ and $B_{N-n-1}$ and the second negative function 320n2 implements a logical NOR function of the two bits $B_n$ and $B_{N-n-1}$. Table 2 below shows the truth table of the first positive function 320p1, the second positive function 320p2, the first negative function 320n1 and the second negative function 320n2 as well as:

the resulting positive current component contribution $I_{qn}+$ and the negative current component contribution $I_{qn}-$, a magnitude of which is the analog representation of the considered same value of coefficients processing the two bits $B_n$ and $B_{N-n-1}$; and the corresponding output differential current $I_{diffn}=I_{qn+}-I_{qn-}$.

TABLE 2

Truth table of the first positive function 320p1, the second positive function 320p2, the first negative function 320n1 and the second negative function 320n2

| $B_n$ | $B_{N-n-1}$ | $BL_n$ | $\overline{BL_n}$ | $BR_n$ | $\overline{BR_n}$ | $I_{qn}+$ | $I_{qn}-$ | $I_{diffn}$ |
|---|---|---|---|---|---|---|---|---|
| 0 | 0 | 0 | 1 | 0 | 1 | 0 | I | −I |
| 0 | 1 | 0 | 1 | 1 | 0 | I/2 | I/2 | 0 |

10

TABLE 2-continued

Truth table of the first positive function 320p1, the second positive function 320p2, the first negative function 320n1 and the second negative function 320n2

| $B_n$ | $B_{N-n-1}$ | $BL_n$ | $\overline{BL_n}$ | $BR_n$ | $\overline{BR_n}$ | $I_{qn}+$ | $I_{qn}-$ | $I_{diffn}$ |
|---|---|---|---|---|---|---|---|---|
| 1 | 0 | 0 | 1 | 1 | 0 | I/2 | I/2 | 0 |
| 1 | 1 | 1 | 0 | 1 | 0 | I | 0 | I |

However, in some aspects, the first and second positive functions as well as the first and second negative functions implement other logical functions allowing to achieve the above truth table and thus the corresponding control of the current sources.

In some aspects, the unit delay cells are yet not programmable and only the value of the coefficients in the matrix 330m are reconfigurable through the reconfigurability of the current sources (e.g. through the reconfigurability of the number of positive and negative current sources, or through the reconfigurability of the amount of current that can be output by a given positive or negative current source). This simpler implementation allows achieving different filtering performances (e.g. in term of out-band attenuation and in term of in-band ripple) for impulses responses of same length.

Figure 4:
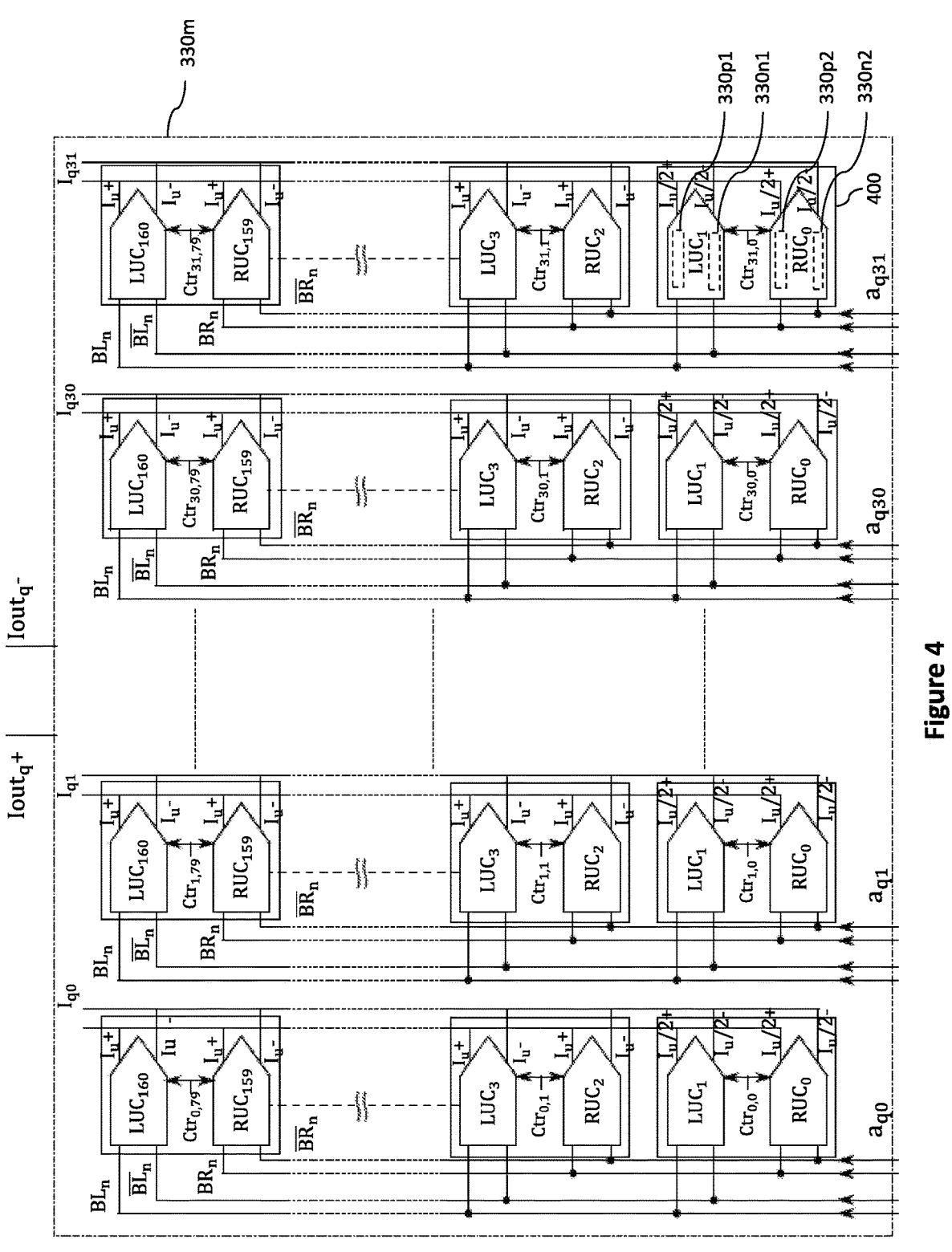
FIG. 4 illustrates a programmable coefficient matrix implemented in the FIRDAC of FIG. 3 according to one embodiment of the present disclosure.

Referring now to FIG. 4, we describe an example of matrix 330m of programmable coefficients.

According to the example of FIG. 4, a unitary cell including one first positive current sources 330p1 and one first negative current sources 330n1 is labelled LUC. Conversely, a unitary cell including one second positive current sources 330p2 and one second negative current sources 330n2 is labelled RUC. The merged unitary cell including one LUC and one RUC is labelled 400. Such merged approach allows an efficient implementation of the current sources and their associated control as detailed below in relation with FIG. 5.

Back to FIG. 4, the matrix 330m comprises eighty merged unitary cell 400 per pair of coefficients of same value. Each merged unitary cell 400 can be turned ON and OFF through a control bit Ctrl that controls the activation of the LUC and RUC of the considered merged unitary cell 400. Consequently, coefficients values ranging from zero to eighty times the current output by a unitary cell can be obtained.

In other aspects, a different number of merged unitary cell 400 per pair of coefficients of same value can be used in order to achieve a different range of programmable coefficients values. For instance, the number of merged unitary cell, L, can be determined as:

$$L = \begin{cases} \dfrac{\lfloor a_{max}/a_{min}\rfloor + 1}{2} & \text{for odd value of } \lfloor a_{max}/a_{min}\rfloor \\[2mm] \dfrac{\lfloor a_{max}/a_{min}\rfloor}{2} & \text{for even values of } \lfloor a_{max}/a_{min}\rfloor \end{cases}$$

where $a_{max}$ is the maximum coefficient value and $a_{min}$ is the minimum coefficient value among the impulse response, and where the notation $\lfloor\ \rfloor$ represents the nearest integer of the value in between the brackets.

In that respect, such matrix of programmable coefficients according to the present disclosure is capable of implementing impulse responses comprising both even and odd number of coefficients. However, for odd number of coefficients, the middle coefficient (i.e. the coefficient for which no symmetric counterpart of same value exists) is subjected for some modifications. Indeed, the amount of current to be output per current source needs to be halved for the middle coefficient due to the elimination of the symmetric coefficient in the above-described approach.

Back to FIG. 4, the positive branch of the total output analog current $I_{outq}+$ is the summation of the output current node $I_{qn}+$ of each vertical column of merged unitary cell 400 addressing a given pair of coefficients of same value. Correspondingly, the negative branch of the total output analog current $I_{outq}-$ is the summation of the output current node $I_{qn}-$ of each vertical column of merged unitary cell 400 addressing the considered given pair of coefficients of same value.

Figure 5:
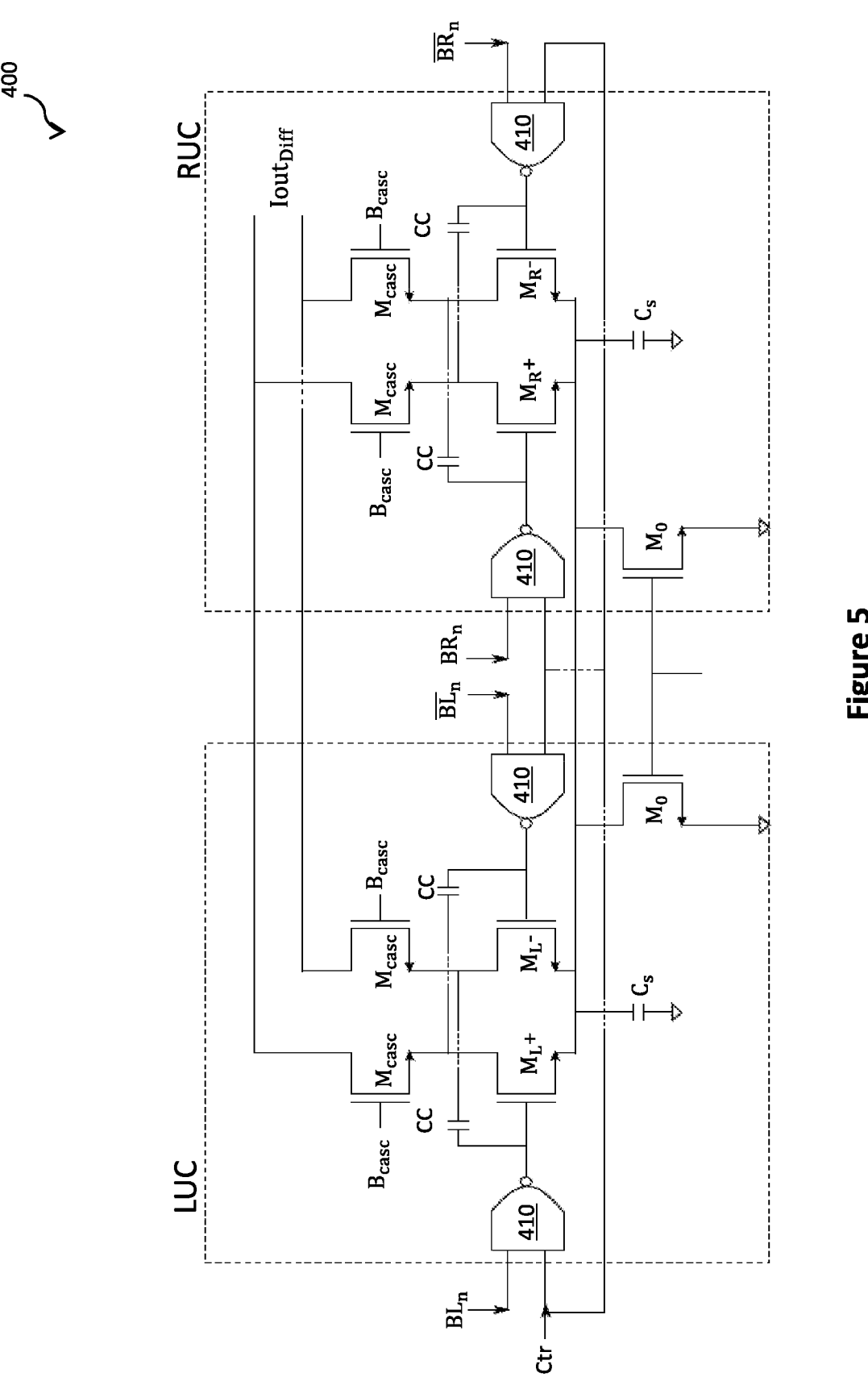
FIG. 5 illustrates the transistor level implementation of a merged unit cell of the programmable coefficient matrix of FIG. 4 according to one embodiment of the present disclosure.

Referring now to FIG. 5, we describe an example of merged unitary cell 400.

More particularly, the architecture of the merged unitary cell 400 relies on 1-bit differential current steering DAC. The main features that are achieved by such architecture of merged unitary cell 400 are:

compactness and small silicon area;
low power consumption;
high speed switching; and
good matching between tail current source.

More particularly, for suppressing the glitches that may corrupt the output waveform during the switching of the common source node differential transistors $M_L+$, $M_L-$, $M_R+$ and $M_R-$ large capacitor value $C_S$ has been added at the common source node.

Conversely, cascode transistors $M_{casc}$ have been added to obtain a high output resistance and for isolation between, on one hand, the switch transistors $M_L+$ and $M_L-$ (i.e. allowing or preventing current to flow from the LUC) or the switch transistors $M_R+$ and $M_R-$ (i.e. allowing or preventing current to flow from the RUC) and, on the other hand, the corresponding high swing output node.

Furthermore, cross-coupling capacitors CC are implemented using e.g. NMOS transistors of the same size like that of $M_L$ or $M_R$, where the gate is the upper plate and source and drain tied together as bottom plate with a grounded bulk. In other words, for the LUC cell we get:

a first capacitor CC connected between, on one hand, the control pin of the positive switch transistor $M_L+$ (i.e. the gate pin) and, on the other hand, an output pin (i.e. the source or drain pin) of the negative switch transistor $M_L-$ from which the current to be controlled is allowed or prevented to flow as a function of a voltage state on the control pin of $M_L+$; and a second capacitor CC connected between, on one hand, a control pin (i.e. the gate pin) of the negative switch transistor $M_L-$ and, on the other hand, an output pin (i.e. the source or drain pin) of the positive switch transistor $M_L+$ from which the current to be controlled is allowed or prevented to flow as a function of a voltage state on the control pin of $M_L-$.

The same holds for the RUC cell. Thus, the high frequency behavior of the current sources for their turning ON and OFF is improved.

In general, such cross-coupling capacitors CC can be implemented on any couple of positive and negative current source concerned with the implementation of a FIRDAC according to the disclosure (in any of the aspects discussed above).

To switch ON/OFF the merged unitary cell 400, NAND gates 410 is used. To activate the merged unitary cell 400, the control signal Ctr is set to high (e.g. to supply voltage Vdd) and the merged unitary cell 400 acts as differential switched current source. If the control signal Ctr is set to low (e.g. to ground), the tail current is halved between the two sides and the output differential current is zero, indicating a deactivated merged unitary cell 400. In other words, for the LUC cell we get:

the control pin of the positive switch transistor $M_L+$ controlled by a signal resulting of the logical NAND function of, on one hand, the control signal Ctr and, on the other hand, an enable signal (e.g. the $BL_n$ signal in the present case) common to all positive current sources generated based on the first positive function 320p1; and the control pin of the negative switch transistor $M_L-$ controlled by a signal resulting of the logical NAND function of, on one hand, the control signal Ctr and, on the other hand, the enable signal common to all positive current sources generated based on the first negative function 320n1 (e.g. the $\overline{BL_n}$ signal in the present case).

The same holds for the RUC cell involving correspondingly the second positive function 320p2 and the second negative function 320n2.

In other aspects, AND gates may be used instead of the NAND gates 410, e.g. by inverting the voltage of the control signal. However, it is worth notifying that using a NAND gate 410 instead of AND gate to switch ON/OFF the merged unitary cell 400 helps in sustaining a fixed total output average current $\overline{I_{outq}+}$ or $\overline{I_{outq}-}$ from the whole matrix 330, independently from the FIRDAC impulse response configuration. Indeed, using a NAND gate 410, even when the merged unitary cell 400 is disabled, yet still each transistor $M_L+$, $M_L-$, $M_R+$ and $M_R-$ supply the same DC current.

According to the aspect of FIG. 5, a CMOS technology is considered for the implementation of the FIRDAC according to the present disclosure (e.g. a 65 nm CMOS technology, a 32 nm CMOS technology, etc.). However, in other aspects, a FIRDAC according to the present disclosure is implemented in another technology (BiCMOS, GaAs, etc.).

Figure 6:
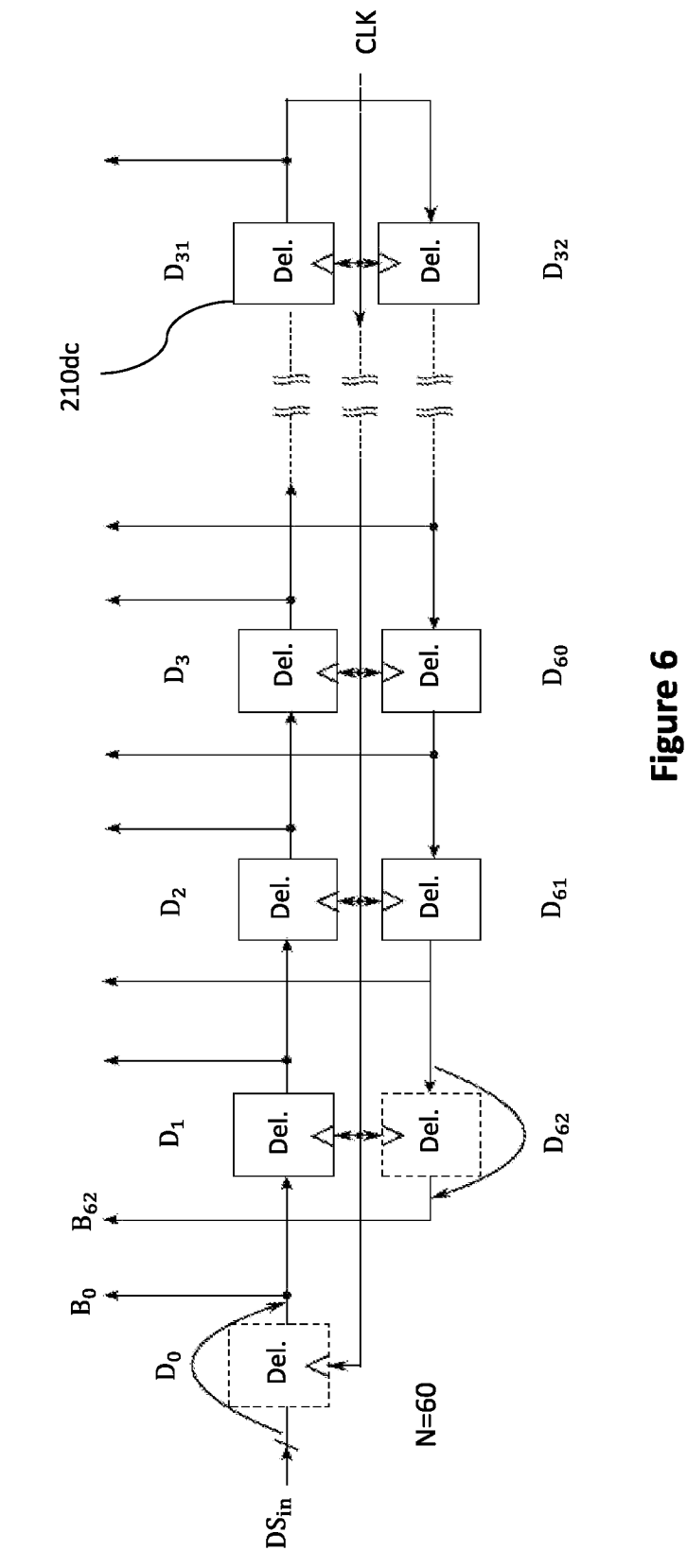
FIG. 6 illustrates a block diagram of the programmable delay line implemented in the FIRDAC of FIG. 2 or of FIG. 3 according to one embodiment of the present disclosure.

Referring now to FIG. 6, we describe an example of delay line 210.

More particularly, the delay line 210 comprise N=63 successive unit delay cells 210dc. However, in other aspects another number N of successive unit delay cells is implemented, having that the total number of delay cells drives the length of the impulse response of the FIR filter, and thus the order of the filter.

Back to FIG. 6, each unit delay cell 210dc outputs a corresponding delayed version, $B_0$, $B_1$, . . . , of the input bits stream to be processed by a corresponding coefficient of the FIR filter. However, in order to have the length of the impulse response of the filter to be programmable (or reconfigurable), one or more of the unit delay cell 210dc can be by-passed as depicted e.g. through the curved arrow around $D_0$ and $D_{62}$ in FIG. 6. This allows to increase or decrease the order of the filter which affects the FIRDAC's specifications: passband ripples, Rp, stopband attenuation, As, and the transition frequency, $\Delta F=Fs-Fp$.

Figure 7:
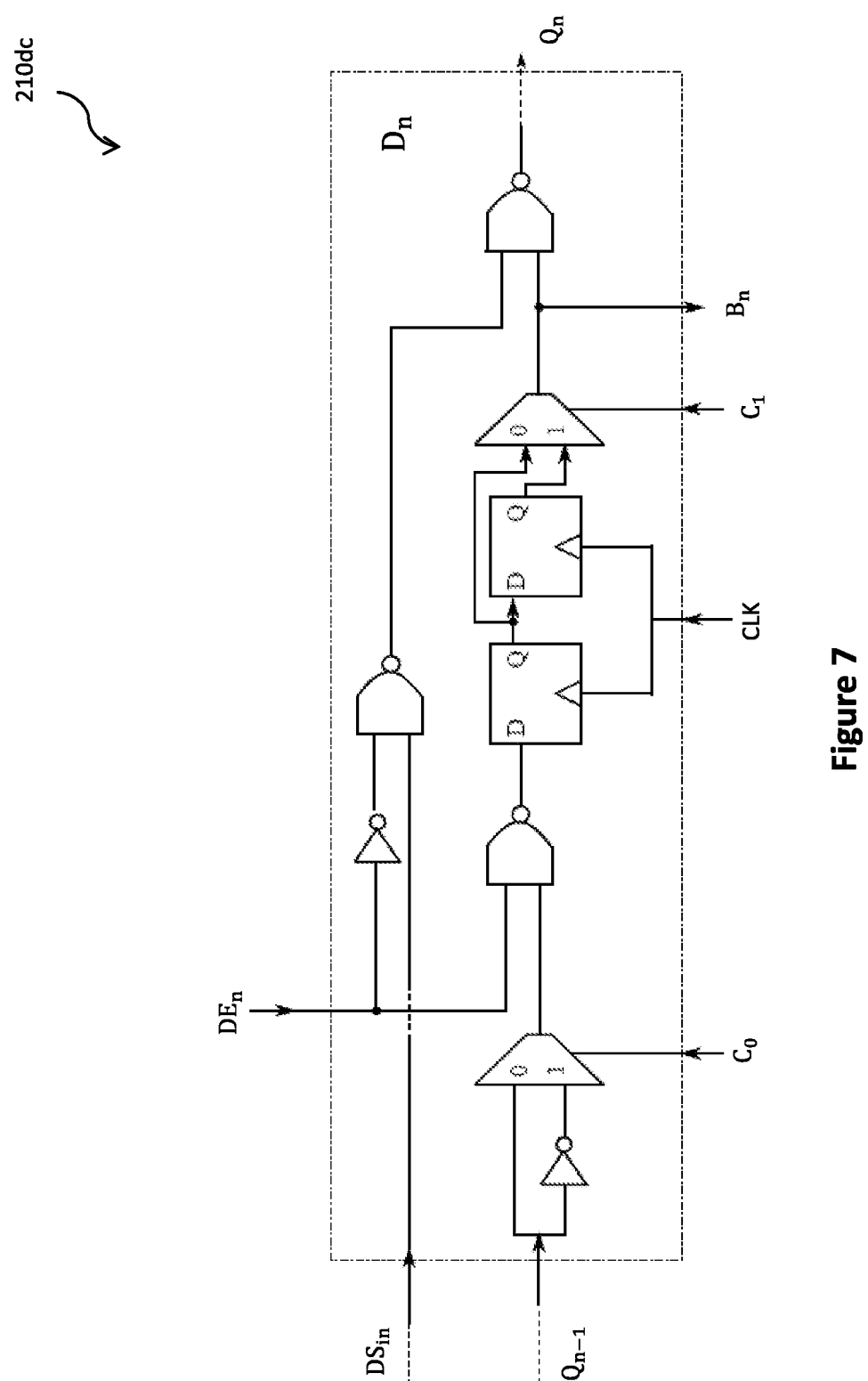
FIG. 7 illustrates a circuit level diagram of a programmable unit delay cell of the programmable delay line of FIG. 6 according to one embodiment of the present disclosure.

Referring now to FIG. 7, we describe an example of unit delay cells 210dc.

More particularly, the unit delay cells 210dc contains both sequential and combinational logic to sustain the aforementioned reconfigurability and tune the FIRDAC filter to operate whether as a lowpass filter (LPF), as a highpass filter (HPF) or as a bandpass filter (BPF). For that, two multiplexers have been implemented and their select port are controlled by two separate control bits $C_0$ and $C_1$:

the signal $C_1$ is responsible to modify the unit delay cells 210dc response for implementing an elementary delay, i.e. a transfer function of $Z^{-1}$, or twice the elementary delay, i.e. a transfer function of $Z^{-2}$. In that respect, the elementary delays are implemented as flip-flop that can be by-passed for allowing the delay line to have either a delay of one clock period or a delay of two clock periods; and the signal $C_0$ is responsible to modify the unit delay cells $210dc$ response for implementing a logical inversion, thus leading to a transfer function of $-Z^{-1}$ or $-Z^{-2}$.

To bypass (i.e. enable/disable) the unit delay cells $210dc$, another control signal ($DE_n$) is implemented. According to the implementation of FIG. 7, when $DE_n$ is in high state, the unit delay cells $210dc$ is activated and the bit $B_n$ is a delayed version of the input $Q_{n-1}$. The unit delay cells $210dc$ is bypassed when $DE_n$ is in a low state, resulting in static high logic state for Bn. In that case, $Q_n$ receives the incoming bits directly from the input of the delay line $210$, i.e. $DS_{in}$.

According to the aforementioned design strategy, it is more convenient to control the unit delay cells $210dc$ numbered $D_n$ and $D_{62-n}$ by the same control bit $DE_n$ as they address the coefficients of same value. This indeed reduces the number of configuration bits. In this regard, Table 3 below shows the truth table of the control signals of the unit delay cells $210dc$ as well as the resulting states and outputs.

TABLE 3 truth table of the control signals of the unit delay cells 210dc as well as the resulting states and outputs

| $DE_n$ | $C_1$ | $C_0$ | $B_n$ | $Q_n$ | $D_n$ state | Corresponding coefficient state |
|---|---|---|---|---|---|---|
| 0 | 0 | 0 | 1 | $DS_{in}$ | Bypassed | OFF |
| 0 | 0 | 1 | 1 | $DS_{in}$ | Bypassed | OFF |
| 0 | 1 | 1 | 1 | $DS_{in}$ | Bypassed | OFF |
| 1 | 0 | 0 | $\overline{Q_{n-1}} * (Z^{-1})$ | $Q_{n-1} * (Z^{-1})$ | Enabled | ON |
| 1 | 0 | 1 | $\overline{Q_{n-1}} * (-Z^{-1})$ | $Q_{n-1} * (-Z^{-1})$ | Enabled | ON |
| 1 | 1 | 1 | $\overline{Q_{n-1}} * (-Z^{-2})$ | $Q_{n-1} * (-Z^{-2})$ | Enabled | ON |

In other aspects, the unit delay cells are controlled independently and can be by-passed independently. In such aspects, the unit delay cells may provide as an output the value they have at their input when they are in a by-passed state.

Figure 8A:
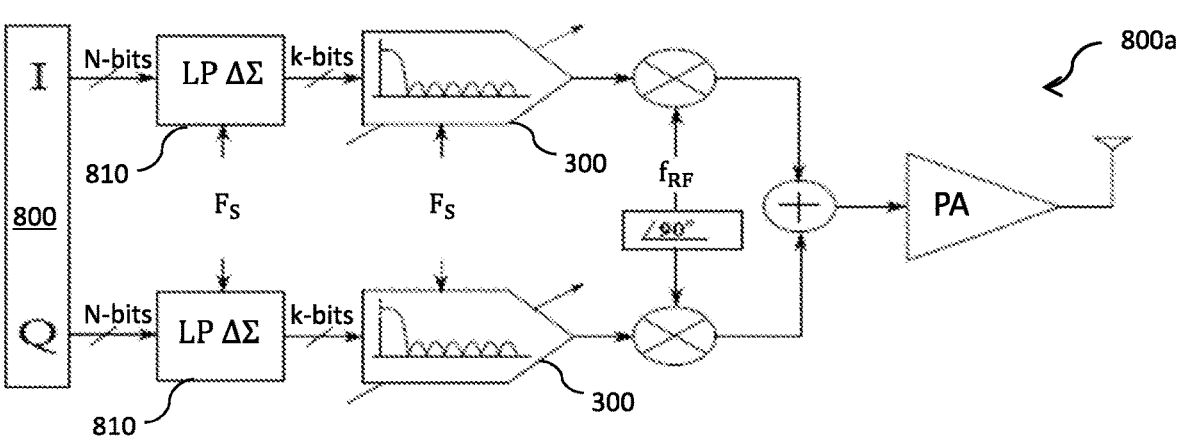
FIGS. 8a, 8b and 8c illustrate the use of the FIRDAC of FIG. 3 in various architectures of wireless transmitters.
Figure 8B:
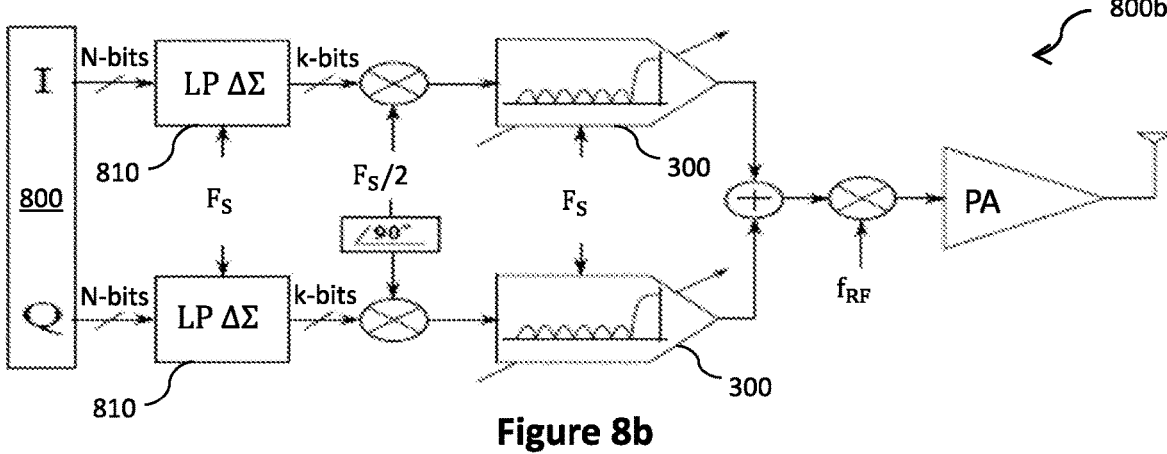
Figure 8C:
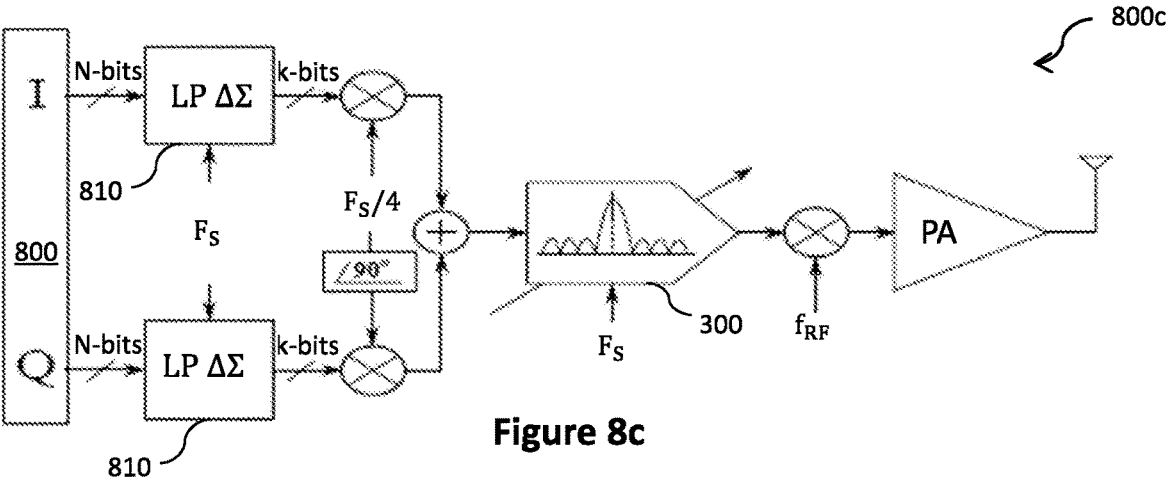

Referring now to FIGS. 8a, 8b and 8c, we describe examples of the use of a FIRDAC according to the present disclosure in various architectures of wireless transmitters.

In the present examples, the FIRDAC considered is the FIRDAC 300 described above in relation with FIG. 3. However, other FIRDACs according to the present disclosure (in any of the aspects discussed above) could equally be considered in such applications.

One of the features of the proposed FIRDAC is that it has a tunable filter response where it is capable to operate either as a LPF, HPF or BPF. Thus, the implemented FIRDAC 300 owns the flexibility to be employed in one of the transmit architectures shown in FIGS. 8a, 8b and 8c.

For instance, the transmitter 800a of FIG. 8a comprises a I/Q modulator 800 that delivers samples of the I and Q signals of the modulating signal. Such signals are shaped by the lowpass Delta-Sigma ($\Delta\Sigma$) modulator 810 before being delivered to the FIRDAC 300 for digital to analog conversion. The FIRDAC 300 further filters the high frequency noise resulting of the noise shaping of the $\Delta\Sigma$ modulator 810. The analog signals output by the FIRDACs 300 are upconverted by LO signals in quadrature and summed for achieving the bandpass modulated RF signal after summation. The modulated RF signal is in turn amplified by the power amplifier (PA).

In such architecture, the FIRDAC 300 is configured as a LPF FIRDAC.

Conversely, in the transmitter 800b of FIG. 8b, the spectrum of the signals delivered by the $\Delta\Sigma$ modulators 810 are flipped through upconversion using LO signals with a frequency corresponding to half the sampling rate of the signals delivered by the $\Delta\Sigma$ modulators 810. The FIRDAC 300 are thus implemented as HPF FIRDAC for filtering the noise resulting of the noise shaping of the $\Delta\Sigma$ modulator 810 and transposed in frequency.

In the transmitter 800c of FIG. 8c, the signals delivered by the $\Delta\Sigma$ modulators 810 are upconverted and a modulated bandpass signal is then obtained by summing the upconverted signals. The FIRDAC 300 applies to the obtained modulated bandpass signal and is thus implemented as a BPF FIRDAC.

A FIRDAC according to the present disclosure (in any of the aspects discussed above) can thus be used for generating a radiofrequency signal from a digital input stream. Thanks to the flexibility of the proposed solution, a same reconfigurable FIRDAC according to the present disclosure can be used in many different transmit architectures. For instance, a multi standard transmitter (e.g. for addressing the 2G, 3G, 4G, 5G, . . . cellular standards), capable to comply with the constrains of each standard, can be considered using a reconfigurable FIRDAC according to the present disclosure.

What is claimed is:

1. An electronic device for digital to analog conversion of a digital input stream into a differential analog output, said device implementing a filtering of said digital input stream based on a finite impulse response filter comprising:
    a delay line taking as an input said digital input stream, said delay line implementing a number of successive delay cells, each delay cell outputting a corresponding delayed version of the digital input stream to be processed by a corresponding coefficient of said filter;
    for at least one coefficient of said finite impulse response filter, a number of current sources comprising current sources, named positive current sources, contributing to a positive component of said differential analog output and current sources, named negative current sources, contributing to a negative component of said differential analog output, the positive component contribution of the positive current sources and the negative component contribution of the negative current sources being each proportional to said coefficient according to a same proportionality factor for implementing said coefficient,
    characterized in that the positive component contribution of the positive current sources and the negative component contribution of the negative current sources are reconfigurable between predetermined values for allowing the value of the coefficient to be reconfigurable.

2. The electronic device according to claim 1 wherein said delay line implements a programmable number of said delay cells.

3. The electronic device according to claim 1 wherein at least one of said delay cells implements a programmable delay comprising an elementary delay or twice said elementary delay.

4. The electronic device according to claim 3 wherein said at least one of said delay cells implements in inversion of the logical value of the delayed bits.

5. The electronic device according to claim 1 wherein said finite impulse response is symmetrical and wherein for at least one couple of symmetric coefficients of same value of said symmetric finite impulse response filter:

the positive current sources implementing the coefficients of said couple are configured based on an output of at least one logical function, named positive function, involving two bits simultaneously processed by said coefficients of same value, the negative current sources implementing the coefficients of said couple are configured based on an output of at least one logical function, named negative function, involving said two bits, the at least one positive and negative functions being configured such that:

when said two bits have different logical values: the positive current sources and the negative current sources implementing the coefficients of said couple output a same amount of current, the differential analog output being null; and when said two bits have a same logical value: the positive current sources or the negative current sources implementing the coefficients of said couple are turned OFF so that the differential analog output has a magnitude proportional to said same value of said coefficients and a sign given by said same logical value.

6. The electronic device according to claim 5, wherein said positive current sources implementing the coefficients of said couple are configured based on an output of one positive function and said negative current sources implementing the coefficients of said couple are configured based on an output of one negative function, and wherein the positive function and the negative function are such that when said two bits have different logical values, the positive current sources implementing the coefficients of said couple are turned OFF and the negative current sources implementing the coefficients of said couple are turned OFF, the differential analog output being null.

7. The electronic device according to claim 6 wherein the positive function implements a logical AND function of said two bits, and wherein the negative function implements a logical NOR function of said two bits.

8. The electronic device according to claim 5 wherein said positive current sources implementing the coefficients of said couple comprise first positive current sources configured based on an output of a first positive function and second positive current sources configured based on an output of a second positive function, wherein said negative current sources implementing the coefficients of said couple comprise first negative current sources configured based on an output of a first negative function and second negative current sources configured based on an output of a second negative function, wherein the first and second positive and negative functions are configured such that, when said two bits have different logical values:

one of the first and second positive current sources is turned ON, the other one of the first and second positive current sources being turned OFF; and one of the first and second negative current sources is turned ON, the other one of the first and second negative current sources being turned OFF, the positive current sources turned ON and the negative current sources turned ON outputting a same amount of current, the differential analog output being null.

9. The electronic device according to claim 8 wherein said first positive function implements a logical AND function of said two bits, and wherein the first negative function implements a logical NAND function of said two bits.

10. The electronic device according to claim 8 wherein said second positive function implements a logical OR function of said two bits, and wherein the second negative function implements a logical NOR function of said two bits.

11. The electronic device according to claim 1 wherein at least one of said positive current sources comprise a transistor, named positive switch transistor, controlled as a switch for allowing or preventing current to flow from the corresponding positive current source, wherein at least one of said negative current sources comprise a transistor, named negative switch transistor, controlled as a switch for allowing or preventing current to flow from the corresponding negative current source, a first capacitor being connected between a control pin of said positive switch transistor and an output pin of said negative switch transistor from which the current to be controlled is allowed or prevented to flow as a function of a voltage state on said control pin, a second capacitor being connected between a control pin of said negative switch transistor and an output pin of said positive switch transistor from which the current to be controlled is allowed or prevented to flow as a function of a voltage state on said control pin.

12. The electronic device according to claim 8, comprising:

wherein at least one of said positive current sources comprise a transistor, named positive switch transistor, controlled as a switch for allowing or preventing current to flow from the corresponding positive current source, wherein at least one of said negative current sources comprise a transistor, named negative switch transistor, controlled as a switch for allowing or preventing current to flow from the corresponding negative current source, a first capacitor being connected between a control pin of said positive switch transistor and an output pin of said negative switch transistor from which the current to be controlled is allowed or prevented to flow as a function of a voltage state on said control pin, a second capacitor being connected between a control pin of said negative switch transistor and an output pin of said positive switch transistor from which the current to be controlled is allowed or prevented to flow as a function of a voltage state on said control pin, and at least one cell comprising:

a positive current source comprising a positive switch transistor controlled as a switch for allowing or preventing current to flow from the corresponding positive current source; and a negative current source comprising a negative switch transistor controlled as a switch for allowing or preventing current to flow from the corresponding negative current source, wherein a control pin of the positive switch transistor is controlled by a signal resulting of a logical function of a control signal and an enable signal common to all positive current sources and generated based on said first positive function or on said second positive function, wherein a control pin of the negative switch transistor is controlled by a signal resulting of a logical function of the control signal and an enable common to all positive current sources and generated based on said first negative function or on said second negative function.

13. A radiofrequency transmitter system comprising an electronic device according to claim 1.

14. The radiofrequency transmitter system according to claim 13 comprising a sigma-delta modulator for generating said digital input stream.

15. Use of an electronic device according to claim 1 for generating a radiofrequency signal from a digital input stream.

\* \* \* \* \*